US009250282B2

(12) United States Patent
Ukil et al.

(10) Patent No.: US 9,250,282 B2
(45) Date of Patent: Feb. 2, 2016

(54) FAULT PARAMETER INDICATOR DEVICE AND RELATED METHODS

(71) Applicant: ABB RESEARCH LTD, Zürich (CH)

(72) Inventors: Abhisek Ukil, Baden (CH); Bernhard Deck, Weilheim (DE); Vishal H. Shah, Vadodara (IN)

(73) Assignee: ABB RESEARCH LTD, Zurich (CH)

( * ) Notice: Subject to any disclaimer, the term of this patent is extended or adjusted under 35 U.S.C. 154(b) by 273 days.

(21) Appl. No.: 13/751,474

(22) Filed: Jan. 28, 2013

(65) Prior Publication Data

US 2013/0141827 A1 Jun. 6, 2013

Related U.S. Application Data

(63) Continuation of application No. PCT/EP2011/063587, filed on Aug. 8, 2011.

(30) Foreign Application Priority Data

Aug. 13, 2010 (EP) ..................................... 10172782

(51) Int. Cl.
*H02H 3/08* (2006.01)
*G01R 31/02* (2006.01)
(Continued)

(52) U.S. Cl.
CPC ................. *G01R 31/02* (2013.01); *G06F 17/00* (2013.01); *H02H 3/081* (2013.01); *H02H 3/38* (2013.01)

(58) Field of Classification Search
CPC .......... H02H 3/081; H02H 3/38; G06F 17/00; G01R 31/02
See application file for complete search history.

(56) References Cited

U.S. PATENT DOCUMENTS 5,471,359 A * 11/1995 Simpson et al. ............. 361/93.2
6,307,723 B1 10/2001 Hindle et al.
(Continued)

FOREIGN PATENT DOCUMENTS

EP 0971471 A2 1/2000

OTHER PUBLICATIONS

International Search Report (PCT/ISA/210) issued on Dec. 13, 2011, by the European Patent Office as the International Searching Authority for International Application No. PCT/EP2011/063587.
Written Opinion (PCT/ISA/237) issued on Dec. 13, 2011, by the Japanese Patent Office as the International Searching Authority for International Application No. PCT/EP2011/063587.
International Preliminary Report on Patentability (PCT/IPEA/409) issued on Aug. 22, 2012 by the European Patent Office as International Examining Authority for International Application No. PCT/EP2011/063587.
(Continued)

*Primary Examiner* — Zeev V Kitov
(74) *Attorney, Agent, or Firm* — Buchanan Ingersoll & Rooney PC

(57) ABSTRACT

A method of determining a fault parameter of a fault on an AC transmission line 10 of a power distribution system 1 relative to a measurement location 12 of the transmission line 10 comprising: measuring a time-dependent current of the transmission line 10 at the measurement location 12; transmitting a current signal indicative of the measured current to a decision logic section 36, the current signal comprising a plurality of pre-fault current values and a plurality of post-fault current values; determining, by the decision logic section 36, a plurality of phase difference values indicative of respective phase differences between respective pre-fault current values and respective post-fault current values; accumulating the plurality of phase difference values into an accumulated phase difference parameter; obtaining the fault parameter by comparing the accumulated phase difference parameter to a threshold value; and outputting the determined fault parameter.

13 Claims, 5 Drawing Sheets

(51) Int. Cl.
*H02H 3/38* (2006.01)
*G06F 17/00* (2006.01)

(56) References Cited

U.S. PATENT DOCUMENTS 7,969,155 B2 * 6/2011 Varghai et al. ............... 324/521
2009/0009180 A1 1/2009 Varghai et al.

OTHER PUBLICATIONS

Moustafa Mohammed Eissa, Evaluation of a New Current Directional Protection Technique Using Field Data, IEEE Transactions on Power Delivery, vol. 20, No. 2, Apr. 2005, pp. 566-572.
Hammad A Khan, et al., Review of Technologies and Implementation Strategies in the Area of Smart Grid, Power Engineering Conference, Australasian Universities, IEEE, Piscataway, NJ, USA, Sep. 27, 2009, pp. 1-6.

* cited by examiner

FAULT PARAMETER INDICATOR DEVICE AND RELATED METHODS

RELATED APPLICATION(S)

This application claims priority as a continuation application under 35 U.S.C. §120 to PCT/EP2011/063587, which was filed as an International Application on Aug. 8, 2011 designating the U.S., and which claims priority to European Application 10172782.4 filed in Europe on Aug. 13, 2010. The entire contents of these applications are hereby incorporated by reference in their entireties.

FIELD

This disclosure relates to a fault parameter indicator device for a power distribution system, for example, to a fault parameter indicator device for indicating a parameter of a fault on a transmission line, including a fault direction.

BACKGROUND INFORMATION

Directional overcurrent relays are widely used for the protection of power distribution systems such as radial and ring subtransmission systems and other distribution systems. These relays have a functionality enabling them to determine a fault direction. Here, a fault can mean an overcurrent, for example, from a short circuit. Further, the fault direction is in most cases binary information, indicating whether the fault is a forward fault or a backward fault. Here, in a power line connecting an upstream power source to a downstream power distribution system portion (with the normal power direction from upstream to downstream), the forward direction is downstream of the relay, and the backward, or reverse, direction is upstream of the relay.

In smart grids, decentralized or distributed units can feed power into the grid or consume power from the grid. Thus, in smart grids the power flow direction can change with time. In this situation, "forward" and "reverse" can still be defined as above with respect to the current power flow, so that e.g. the forward direction will change if the power flow is reversed.

The fault direction can be an indicator at which side of a measurement location the fault has occurred. In the above example, there are two directions, forward and backward. If the measurement location is at a node of the power network having more than two sides, there may be more than just a forward or a backward direction. For example, for a node to which one backward line portion and two forward line portions are connected, the fault direction can include the cases "forward-1", "forward-2", and "backward".

The directional information provides a more detailed information about the location at which a fault has occurred. This information can be used to deactivate a smaller portion of the power distribution system in the case of a fault. For example, a known ring-main feeder, e.g. for domestic supplies has breakers at its T-junctions. If there is a fault in any of the lines of this known ring-main feeder, the whole line section can be interrupted. This situation can be improved when more detailed fault directional information is obtained. To address this situation, directional overcurrent relays can be installed in the line along with breaking switches. With such a relay-switch system, a reference voltage measurement allows computing the fault current and its direction. The directional information can then be used to disconnect only the appropriate section, rather than the whole line.

Known directional overcurrent relays rely on a reference voltage phasor, also known as "voltage polarization", for estimating the direction of the fault. When a fault occurs, the fault current has a characteristic phase angle relative to the voltage phasor, the phase angle depending on the fault direction. The fault direction is determined by comparing the current phasor (complex current value whose real part is the actual AC current) to a reference voltage phasor (industrially termed as 'voltage polarization') measured at a measurement location on the power line. This specifies measurement of both current and voltage. This approach becomes unreliable when the fault is in close proximity to the relay, because in this case, the relay is almost grounded by the short circuit (industrially termed as 'close-in faults').

Further, overcurrent relays including a voltage measurement unit are expensive. Since they have to be used in large number for the above arrangement, this is a major cost factor.

Eissa M. M. discloses in "Evaluation of New Current Directional Protection Technique Using Field Data", IEEE Transactions on Power Delivery, IEEE Service Center, New York, N.Y., US, vol. 20, no. 2, (1 Apr. 2005), pages 566-572, XP011129251, ISSN:0885-8977 a current polarized directional element technique to determine the fault direction on a transmission line using fault data recorded in field. To determine the fault direction a sum of plain current signals is evaluated. It is concluded that for a forward fault, the absolute sum of the fault current signal and the polarized current signal are higher than the absolute value of the fault current signal. On the other hand it is concluded that for a reverse fault, the absolute sum of the fault current signal and the polarized current signal are lower than the absolute value of the fault current signal. The obtained absolute sum which does not contain any phase information is further used in the proposed technique to identify directionality and therefore compared to a threshold value. In other words, no accumulation of values containing a phase difference is used.

SUMMARY

An exemplary method of determining a fault parameter, including a fault direction parameter, of a fault on an AC transmission line of a power distribution system relative to a measurement location of the transmission line is disclosed, the method comprising: measuring a time-dependent current of the transmission line at the measurement location; transmitting a current signal indicative of the measured current to a decision logic section, the current signal including a plurality of pre-fault current values and a plurality of post-fault current values; determining, by the decision logic section, a plurality of phase difference values indicative of respective phase differences between respective ones of the pre-fault current values and respective ones of the post-fault current values; accumulating the plurality of phase difference values into an accumulated phase difference parameter; obtaining the fault parameter by comparing the accumulated phase difference parameter to a threshold value; and outputting the determined fault parameter.

An exemplary fault parameter indicator device for indicating a fault parameter including a fault direction parameter of a fault on an AC transmission line of a power distribution system relative to a measurement location of the transmission line is disclosed, the fault parameter indicator device comprising: an input section for receiving a current signal indicative of a time-dependent current measured by a measuring unit at the measurement location, the current signal having a plurality of pre-fault current values and a plurality of post-fault current values; a decision logic section configured for determining the fault parameter based on the current signal, the decision logic section including: a phase difference value determining sub-section configured to determine a plurality of phase difference values indicative of respective phase differences between respective ones of the pre-fault current values and respective ones of the post-fault current values; an accumulating sub-section configured to accumulate the plurality of phase difference values into an accumulated phase difference parameter; and a fault parameter generating sub-section configured to generate the fault parameter by comparing the accumulated phase difference parameter to a threshold value.

An exemplary directional overcurrent relay is disclosed comprising: a fault parameter indicator device having an input section for receiving a current signal indicative of a time-dependent current measured by a measuring unit at the measurement location, the current signal having a plurality of pre-fault current values and a plurality of post-fault current values; a decision logic section configured for determining the fault parameter based on the current signal, the decision logic section including: a phase difference value determining sub-section configured to determine a plurality of phase difference values indicative of respective phase differences between respective ones of the pre-fault current values and respective ones of the post-fault current values; an accumulating sub-section configured to accumulate the plurality of phase difference values into an accumulated phase difference parameter; and a fault parameter generating sub-section configured to generate the fault parameter by comparing the accumulated phase difference parameter to a threshold value, and a circuit breaker operatively coupled to the fault direction indicator device for receiving, from the fault parameter indicator device, the fault parameter being a fault direction parameter.

An exemplary outdoor and/or smart grid power distribution network is disclosed, comprising: a fault parameter indicator device having an input section for receiving a current signal indicative of a time-dependent current measured by a measuring unit at the measurement location, the current signal having a plurality of pre-fault current values and a plurality of post-fault current values; a decision logic section configured for determining the fault parameter based on the current signal, the decision logic section including: a phase difference value determining sub-section configured to determine a plurality of phase difference values indicative of respective phase differences between respective ones of the pre-fault current values and respective ones of the post-fault current values; an accumulating sub-section configured to accumulate the plurality of phase difference values into an accumulated phase difference parameter; and a fault parameter generating sub-section configured to generate the fault parameter by comparing the accumulated phase difference parameter to a threshold value.

BRIEF DESCRIPTION OF THE DRAWINGS

The details will be described in the following with reference to the figures, wherein.

DETAILED DESCRIPTION

Figure 1:
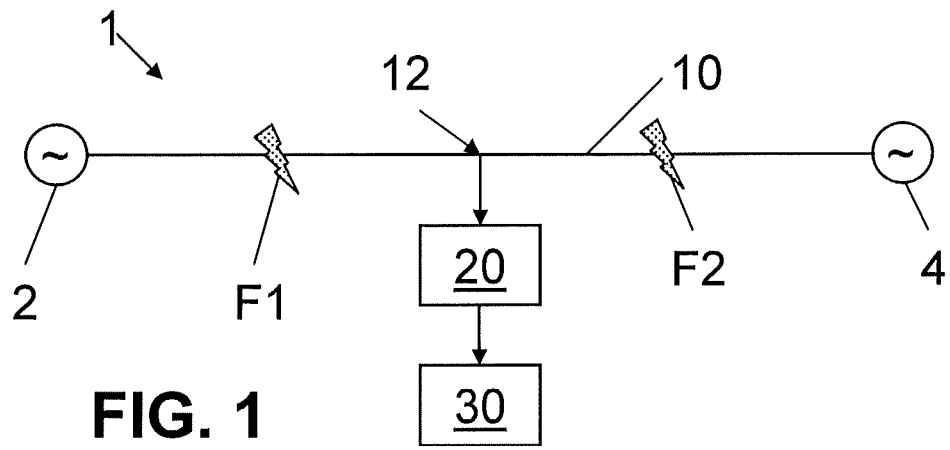
FIG. 1 shows a power distribution system, including a measuring unit and a fault direction indicator device in accordance with an exemplary embodiment of the present disclosure, according to an embodiment.

According to an exemplary embodiment, a method of determining a fault parameter (such as a fault direction parameter) of a fault on an AC transmission line of a power distribution system relative to a measurement location of the transmission line, e.g. for outdoor applications, is provided. The method includes (e.g., comprises) measuring a time-dependent current of the transmission line at the measurement location; transmitting a current signal indicative of the measured current to a decision logic section, the current signal having a plurality of pre-fault current values and a plurality of post-fault current values; determining, by the decision logic section, a plurality of phase difference values indicative of respective phase differences between respective ones of the pre-fault current values and respective ones of the post-fault current values, wherein the phase difference values are computed, by Fourier analysis or other methods; accumulating the plurality of phase difference values into an accumulated phase difference parameter; obtaining the fault parameter by comparing the accumulated phase difference parameter to a threshold value; and outputting the determined fault parameter.

According to another exemplary embodiment of the present disclosure, a fault parameter indicator device for indicating a fault parameter (such as a fault direction parameter) of a fault on an AC transmission line of a power distribution system, relative to a measurement location of the transmission line, is provided. The fault parameter indicator device includes an input section for receiving a current signal indicative of a time-dependent current measured by a measuring unit at the measurement location, the current signal including a plurality of pre-fault current values and a plurality of post-fault current values; and a decision logic section configured for determining the fault parameter based on the current signal. The decision logic section includes a phase difference value determining sub-section configured to determine a plurality of phase difference values indicative of respective phase differences between respective ones of the pre-fault current values and respective ones of the post-fault current values; an accumulating sub-section configured to accumulate the plurality of phase difference values into an accumulated phase difference parameter; and a fault parameter generating sub-section configured to generate the fault parameter by comparing the accumulated phase difference parameter to a threshold value. According to an exemplary embodiment, the decision logic section is configured for carrying out any method steps described herein.

The above features allow for determining a fault parameter such as a fault direction reliably and efficiently at reduced cost. The cost reduction, among other factors, is possible because no voltage measurement is specified.

Further, this method allows estimating e.g. the direction of a fault even if the fault is located near the relay or sub-station, known as a 'close-in fault'. The direction of such faults is difficult to estimate by using a conventional voltage-based method, because the input voltages at the measurement location tend to become zero. Since the above features rely on a current measurement, there is no such problem in this case.

Further, the above allows for selecting a phase angle sensitivity independently of a sampling rate of the current measurement. For example, a phase angle sensitivity can be obtained which is lower than the normal phase change between two current measurements (sampling angle).

Reference will now be made in detail to the various embodiments, one or more examples of which are illustrated in each figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations. The examples below relate to a fault direction indicator device. However, the methods described herein can also be used in other protection functions (other than direction estimation).

Within the following description of the drawings, the same reference numbers refer to the same or to similar components. Only the differences with respect to the individual embodiments are described. Unless specified otherwise, the description of a part or feature in one embodiment also applies to a corresponding part or feature in another embodiment.

Herein, when reference is made to a current value measured at a specific time or to a time-domain current value measurement, such terminology implies that a time can be assigned to such a measurement, but not necessarily that the measurement is completely local in time. For example, the measurement may be smeared in time or may include information obtained at other times, as long as a specific time can still reasonably be assigned to the measurement (e.g. a mean time). For example, for obtaining the imaginary part of a measured current value, a Fourier transformation may be used which includes information from measurements obtained at other times.

Also, if it is stated that pre-fault and post-fault signals are transmitted, this does not necessarily imply that a distinction between pre-fault and post-fault signals would be known at the time of transmitting. Such a distinction may also be established at a time after transmission e.g. after the processing of the signals or after obtaining additional information from other sources.

Device Description

FIG. 1 shows a power distribution system, including a measuring unit and a fault direction indicator device in accordance with an exemplary embodiment of the present disclosure, according to an embodiment. As shown in FIG. 1, a transmission line 10 connects a power source 2 (e.g. a distributed generation source bus) to a grid 4, such as to feed the grid 4 from the power source 2. Further, a measuring unit 20 is connected to the transmission line 10 at a measurement location 12. Relative to the measurement location 12, the transmission line is divided into an upstream, or backward, portion (side of the source 2, between source and relay) and a downstream, or forward, portion (side of the grid 4, between relay and line or grid). As described above, in smart grids the power flow direction may change with time, but "forward" and "reverse" can still be defined with respect to the current power flow.

The measuring unit 20 is adapted for measuring a current flowing in the transmission line 10 at the measurement location 12. A fault direction indicator device 30 receives a current signal indicative of the measured current from the measuring unit 20, and has the functionality of indicating a direction of a fault on a transmission line 10 from the current data, e.g., of indicating whether the fault has occurred in the backward direction or in the forward direction relative to the measurement location 12.

The measurement unit 20 includes a current sensor for measuring the current at the measurement location 12 of the transmission line 10. It does not include any voltage sensor. The measurement unit 20 is operatively coupled to the fault direction indicator device 30 (more precisely, to the input section 32 thereof shown in FIG. 4 below) for transmitting a current signal obtained from the current measurement to the fault direction indicator device 30 (to the input section 32).

As will be described in more detail below, the fault direction indicator device 30 has the functionality to indicate the directional information by using only the current data provided from the measuring unit 20, without any reference voltage. This results in a major cost advantage, because a voltage sensor can be omitted from the measuring unit 20. Since a power distribution system specifies many relays as the one depicted in FIG. 1, the overall cost advantage can be significant.

In exemplary embodiments, the configuration can be more complex, e.g. when the transmission line 12 is not directly connected to the power source 2 upstream, but is connected via a bus of a more complex network. Similarly, the downstream configuration may be more complex. Also, for simplicity only a single-phase line is shown. The network can have more phases (e.g., three phases). The case of more than one single-phase line will be further discussed below.

Figure 4:
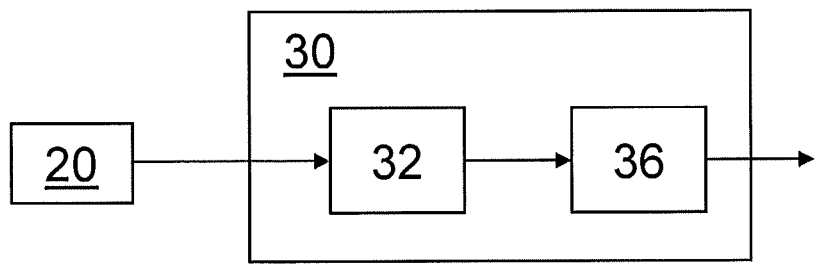
FIG. 4 shows the measuring unit and the fault direction indicator device of FIG. 1 in accordance with an exemplary embodiment of the present disclosure.

FIG. 4 shows the measuring unit and the fault direction indicator device of FIG. 1 in accordance with an exemplary embodiment of the present disclosure. Now, with reference to FIG. 4, the fault direction indicator device 30 of FIG. 1 is described in more detail. The fault direction indicator device 30 has an input section 32 and a decision logic section 36. The input section 32 is adapted to receive transmission line data, e.g., data relating to the transmission line, and in an exemplary embodiment the current signal from the measuring unit 20, without receiving any voltage signal.

Thus, the transmission line data received by the input section 32 can include the current signal and possibly other non-voltage data, but does not include any voltage data or e.g. mixed current-voltage data. In other words, the transmission line data is free of data resulting from a voltage measurement.

The decision logic section 36 is operatively connected to the input section 32 for receiving the transmission line data (which also includes the case of data processed from the transmission line data). The decision logic section 36 includes a first fault direction determining program for determining the fault direction from the transmission line data and for outputting the determined fault direction as a first fault direction indicator.

Fault Direction Determining Program

In the following, the decision logic section 36, which includes the first fault direction determining program will be described in more detail. The program's task is to extract the direction information from the transmission line data, e.g., from the current signals, in case of a fault. With the algorithms described below, the direction of the fault is detected from current measurements, without using voltage signals.

Underlying Model

Before the decision logic is described in detail, the model according to which the fault direction can be derived from the current only will be described with reference to FIGS. 1 to 3. FIG. 1 shows two possible faults of the power transmission line 10, a downstream fault F2 and an upstream fault F1.

In the case of upstream fault F1, the fault current $I_{F1}$ flowing from the grid 4 to the fault F1 is $$I_{F1}=V_4/Z_{4\text{-}F1} \quad (1),$$

wherein $V_4$ is the voltage at the grid 4, and wherein $Z_{4\text{-}F1}$ is the impedance between the grid 4 and the fault location of fault F1. (Here, all quantities are AC quantities given as phasors, e.g., complex numbers). Likewise, in the case of downstream fault F2, the fault current $I_{F2}$ flowing from the source 2 to the fault F2 is $$I_{F2}=V_2/Z_{2\text{-}F2} \quad (2),$$

wherein $V_2$ is the voltage at the source 2, and wherein $Z_{2\text{-}F2}$ is the impedance between the source 2 and the fault location of fault F2.

The impedances $Z_{4\text{-}F1}$ and $Z_{2\text{-}F2}$ are not exactly known and may be different from one another. However, because the line 10 can be almost purely inductive with negligible resistance and capacitance, the impedances $Z_{4\text{-}F1}$ and $Z_{2\text{-}F2}$ are almost purely imaginary with a negative imaginary component.

Now, if $I_{pre}$ is the pre-fault current from the source 2 to the grid 4, then, the total post-fault current $I_1$ in the case of upstream fault F1 is $$I_1=I_{pre}-I_{F1}=I_{pre}-V_4/Z_{4\text{-}F1} \quad (3).$$

Likewise, the total post-fault current $I_2$ in the case of downstream fault F2 is $$I_2=I_{pre}+I_{F2}=I_{pre}+V_2/Z_{2\text{-}F2} \quad (4).$$

Please note the difference in sign, which is due to the fault current $I_{F1}$ being directed in the opposite direction to the pre-fault current (from grid 4 to fault F1), whereas the fault current $I_{F2}$ is directed in the same direction as the pre-fault current (from source 2 to fault F2).

Figure 2:
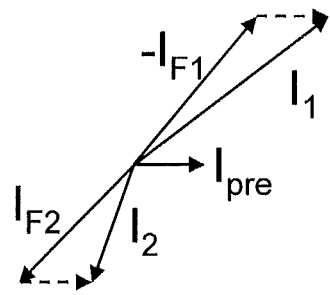
FIG. 2 shows a current-phasor diagram in accordance with an exemplary embodiment of the present disclosure.

This sign difference is visible in the current-phasor diagram of FIG. 2. FIG. 2 shows a current-phasor diagram in accordance with an exemplary embodiment of the present disclosure. Here, the current, represented as a complex number in the complex plane, jumps from $I_{pre}$ to $I_1$ or $I_2$, as given in Eqns. (3) and (4), in the case of a upstream or downstream fault, respectively. Here, the short-circuit current phasors $-I_{F1}$ and $I_{F2}$ by which the current phasor may jump have mutually opposite sign due to the sign difference in Eqns. (3) and (4), and due to $Z_{4\text{-}F1}$ and $Z_{2\text{-}F2}$ being both imaginary with a negative imaginary component. Hence, the phase angle of the post-fault current ($I_1$ or $I_2$) relative to the pre-fault current $I_{pre}$ has a phase change depending on and indicating the fault direction: For example, a positive phase angle change may indicate fault in the upstream direction, while a negative phase angle change may indicate fault in the downstream direction. Hence, it is possible to determine the direction of the post-fault current (forward and backward/reverse) with respect to $I_{pre}$ only, without specifying any bus voltage. Thus, the current alone contains sufficient information to determine the fault direction, namely the information contained in the phase change of the current during the fault.

Figure 3:
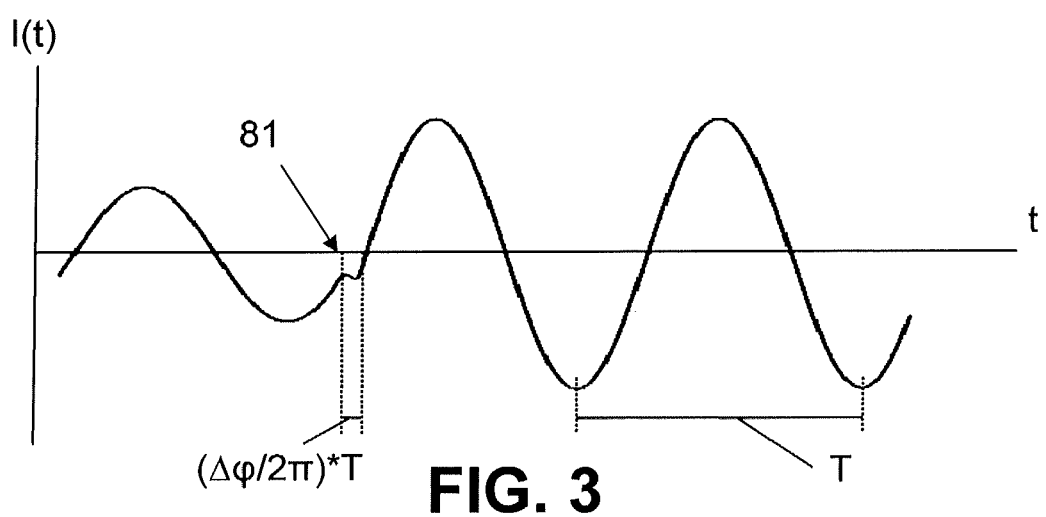
FIG. 3 shows a time-vs.-current diagram in accordance with an exemplary embodiment of the present disclosure.

FIG. 3 shows a time-vs.-current diagram in accordance with an exemplary embodiment of the present disclosure. For example, FIG. 3 is a diagram showing an idealized current as a function of time, in the case of a fault at a fault time 81. The pre-fault current before the fault time 81 is an AC current of sinusoidal shape with AC cycle or AC period T. After the fault, the post-fault current is again an AC current of sinusoidal shape, but with a larger magnitude and a phase shift $\Delta\phi$ with respect to the pre-fault current. In other words, if the pre-fault current can be described by the time-dependence $I_0 \cdot e^{i\omega t}$, then the post-fault current can be described by the time-dependence $c \cdot I_0 \cdot I_0 \cdot e^{i(\omega t + \Delta\phi)}$, wherein c is a real number, and $\phi=2\pi/T$ is the frequency, T being the AC period.

Figure 6:
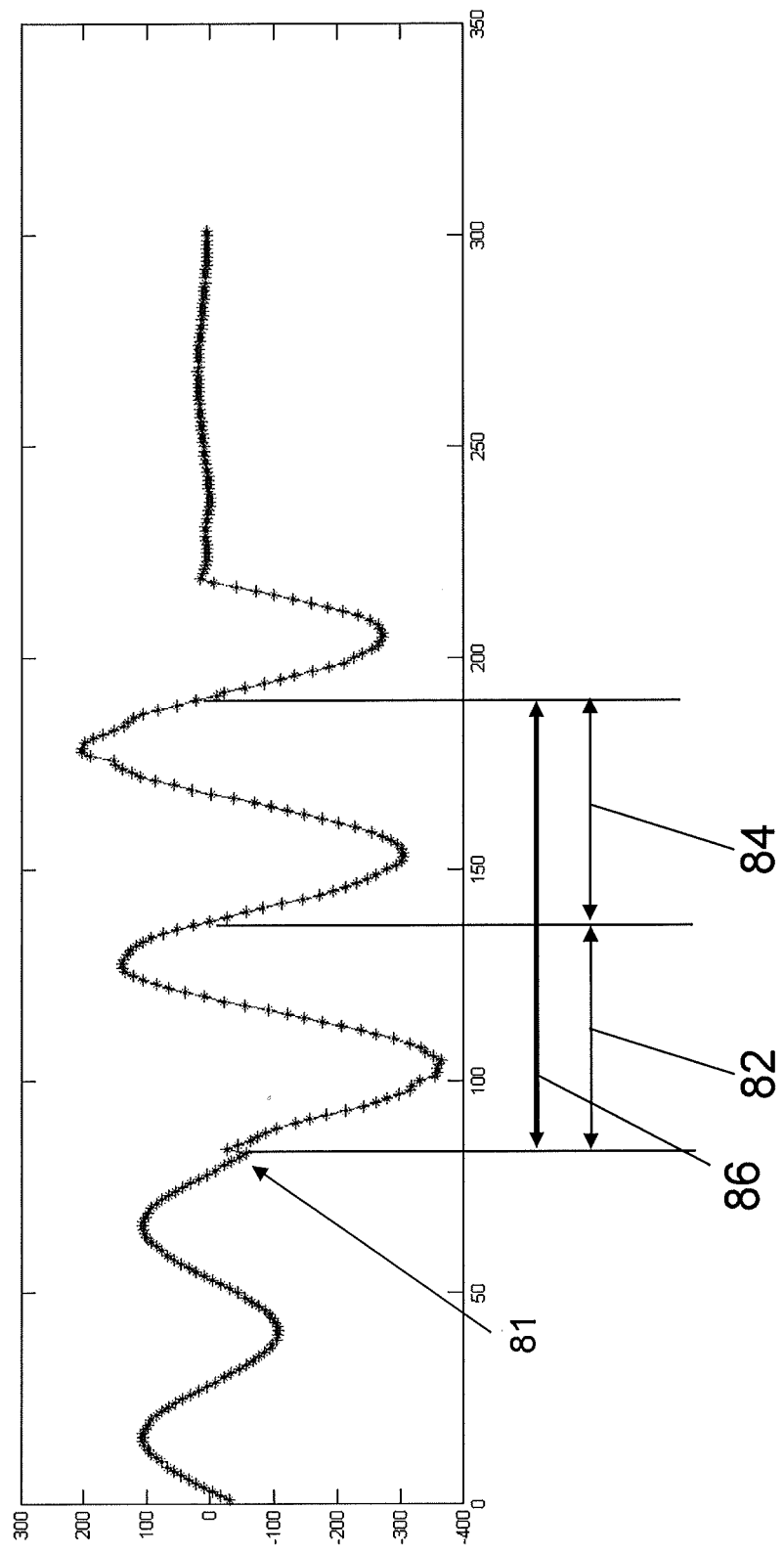
FIG. 6 shows a time-vs.-current diagram illustrating a method of determining the fault direction in accordance with an exemplary embodiment of the present disclosure.

In an exemplary situation, the full curve shown in FIG. 3 is not available. Instead only discrete current values (samples) are measured at a given sampling rate, e.g., sampled at regular time intervals as shown e.g. in FIG. 6. FIG. 6 shows a time-vs.-current diagram illustrating a method of determining the fault direction in accordance with an exemplary embodiment of the present disclosure. As shown in FIG. 6, the sampling rate N is defined as the number of samples obtained per AC cycle T. For example, in FIG. 6, N≈50. In such a situation it is difficult to distinguish a phase shift $\Delta\phi$ that is smaller than about a sampling angle, the sampling angle being defined as 360° divided by the sampling rate N. For example, with a sampling rate of 20 samples per AC cycle, the angular resolution is about 360°/20=18°. Any phase shift substantially below this limit may not be recognized reliably.

Thus, if the phase shift is smaller than about the sampling angle, one would expect that an approach based on the detection of the phase shift becomes unreliable: If, for example, a sample is taken just before the fault inception 81, and if the fault angle change is less than about the sampling angle, then the next sample will be taken after the change, which can result in a false estimation of direction.

To avoid this, one possible solution would be to choose a threshold limit for the measured phase shift, the threshold limit being above about the sampling angle. Then, a fault direction is determined only if the phase shift is larger than the threshold, otherwise "neutral" is outputted, signalling that the fault direction could not be determined reliably. Then, to obtain a reliable prognosis for small angles, one would simply increase the sampling rate in order to obtain a sufficiently small angular resolution (sampling angle).

It turns out that there is a further solution that allows a higher accuracy than the sampling rate. With this algorithm, the increasing of the sampling rate can be avoided. Increasing the sampling rate can increase the cost because some equipment with higher sampling frequency and more powerful hardware and/or software is specified. Also, if existing measurement equipment is used, it is advantageous to be able to select the desired accuracy independently of the sampling rate so that altering the existing sampling rate can be avoided.

It is possible to increase the accuracy above the sampling rate, by waiting a small amount of time after the fault inception. Namely, if a plurality of samples after the fault is analyzed, even a small phase shift can be determined reliably, by the algorithm which is explained in the following with reference to FIG. 6.

According to an exemplary embodiment, the currents are continuously measured by a measurement unit 10 at the measurement location 12 (see FIG. 1), also during normal operation. If a feeder protection system such as a current-only protection device e.g. from ABB is used as the measurement unit, such a system continuously monitors the AC properties of the current and adapts the sampling frequency such that the number of samples per AC cycle corresponds to the sampling rate. Also, a protection device can be capable of representing the current as a complex number with a real part representing the measured current and the imaginary part representing phase information. The complex-number current values are then transmitted, as a current signal, to the fault direction indicator device. The fault direction indicator device stores the complex-number current values in a buffer for some time. For example, the current values corresponding to the last c AC cycles, with c≥1 and preferably c≥4, can be stored in a circular buffer. Here, the current values are referred to as $I_j$, where j is an index representing the number of the sample, some smaller j being the earliest sample and some larger j being the most recent sample. This way of indexing does not necessarily describe the way in which the samples are physically stored or indexed in the device, but are only a shortcut notation for describing the algorithm herein. An example of current values $I_j$ is represented in FIG. 6.

In case of a fault, e.g. the current exceeding a threshold value, a fault signal is issued by the feeder protection system and received by the fault direction indicator device. Namely, at the moment of the fault or shortly thereafter, a start command is issued, in the start time frame 82. If the fault persists for some time, e.g., if the current still exceeds the threshold after a few AC cycles (say, two AC cycles until the end of or after the trip interval 84), a trip command is issued causing a part of the power distribution system to be disconnected. Alternatively, the trip command can also be issued earlier if the current exceeds a further, higher threshold. The start and trip signals can be issued from, e.g., a feeder protection system in response to the current exceeding a threshold value or to some other fault-indicating event. In the following, k shall indicate the index corresponding to a time close to the fault event, ideally the index corresponding to the time of the last sample before the fault event. Then, the currents $I_j$, j≤k, represent the pre-fault currents before the fault, and the currents $I_j$, j>k, represent the post-fault currents. Here, the time of the fault is usually taken as the time at which the "start" command was issued, but also a different indicator of the time of the fault can be used, e.g. an indicator derived from some pattern in the measured current as visible in FIG. 6.

The fault direction indicator device should output the directional information at the time of the trip command, which is normally issued after the trip interval 84. Namely, a "trip" command is issued a few cycles (say, n cycles with n≥1 or even n≥2) after the "start" command or the fault event. In the example of FIG. 6, the "trip" command is to be issued after n=2 cycles after the detected fault event or after the "start" command. The time between the "start" and the "trip" command allows the measurement unit 12 to measure a plurality of (namely, n*N) post-fault current samples and transmit them to the fault direction indicator device 30.

Thus, when the trip command is issued or soon before the trip command is expected to be issued, the fault direction indicator device has a plurality of post-fault current values available, e.g., complex-number values of the sampled current measurements taken after the fault. These post-fault current values are also referred to as $I^{post}(i)=I_{k+i}$, with $1 \leq i \leq n*N$, N being the sample rate.

From the post-fault current values, the decision logic section then determines a plurality of phase difference values, namely the phase difference values $\Delta\phi(I^{post}(i), I^{pre}(i))$ between the i-th post-fault current values $I^{post}(i)$ and the respective i-th pre-fault current values $I^{pre}(i)$. Here, the i-th pre-fault current values $I^{pre}(i)$ are defined as the samples taken at an integer number m of cycles previous to the corresponding i-th post-fault current values $I^{post}(i)$. Thus, if $I^{post}(i)=I_{k+i}$, then $I^{pre}(i)=I_{k+i-m*N}$. Here, the parameter m indicates how many cycles should lie between the i-th pre-fault and post-fault currents, and m can in principle be chosen freely with m≥n. For example, m=n is chosen. In the example of FIG. 6, m=n=2, hence the pre-fault current value $I^{pre}(i)$ is the current sample taken two cycles before the corresponding post-fault current value $I^{post}(i)$. The complex phase difference $\Delta\phi(a, b)$ between two complex numbers a and b is calculated as $\Delta\phi(a, b)=\arctan(\operatorname{Im}(a/b)/\operatorname{Re}(a/b))$. Also, the phase difference values $\Delta\phi(I^{post}(i); I^{pre}(i))$ can be calculated by using, e.g. Fourier analysis or other methods.

After having obtained the plurality of phase difference values $\Delta\phi(I^{post}(i)), I^{pre}(i))$, the decision logic section then accumulates them into an accumulated phase difference parameter $\Delta\phi$. For example, this is done by summing the phase difference values according to the formula $\Delta\phi=\Sigma_{i=1}^{n*N}\Delta\phi(I^{post}(i), I^{pre}(i))$. Also, the accumulated phase difference parameter can be obtained as a weighted sum in which the various parameters are weighted by e.g. their relative reliability.

Then, the decision logic section determines a fault direction parameter by comparing the accumulated phase difference parameter to a threshold value. For example, a reverse fault will be determined if $\Delta\phi>0$, and a forward fault will be determined if $\Delta\phi<0$. In practice, a small threshold number $\epsilon$ is used as a threshold, and a reverse fault will be determined if $\Delta\phi>\epsilon$, and a forward fault will be determined if $\Delta\phi<-\epsilon$. A neutral fault (indicating unknown fault direction) will be issued if $|\Delta\phi|\leq\epsilon$. This way, for situations in which $\Delta\phi$ is close to zero so that its sign can not be determined reliably, the generation of a potentially unreliable signal is avoided. The determined fault direction (forward, backward or neutral) is then outputted.

Regarding the sign of $\Delta\phi$, it is noted that while the sign is indicative of the fault direction, the assignment of a specified sign (positive or negative) to a specified fault direction (forward or backward) depends on a number of line parameters, as well as sign conventions, so there can also be situations in which a reverse fault is expected if $\Delta\phi<0$, and a forward fault is expected if $\Delta\phi>0$.

Figure 7:
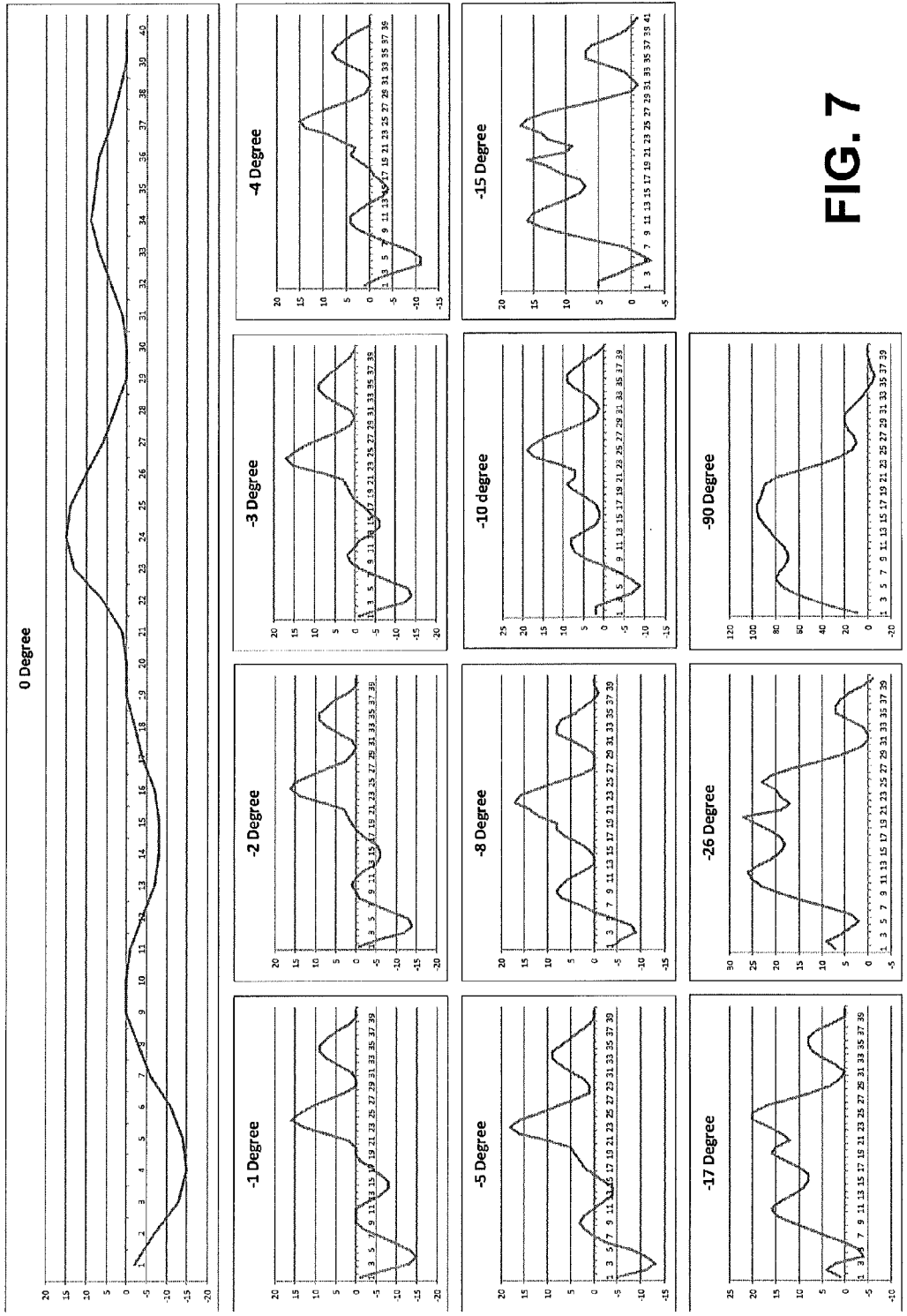
FIG. 7 shows time-vs.-phase difference diagrams illustrating a method of determining the fault direction in accordance with an exemplary embodiment of the present disclosure.

FIG. 7 shows time-vs.-phase difference diagrams illustrating a method of determining the fault direction in accordance with an exemplary embodiment of the present disclosure. FIG. 7 illustrates the above algorithm by showing some determined phase difference values $\Delta\phi(I^{post}(i), I^{pre}(i))$ as a function of i, for a reverse fault with various fault angles (−1 degree to −90 degrees) and a sampling rate of N=20 samples per cycle. According to the model described above, a positive phase difference is expected. Indeed, at least for angles above 5° (absolute value), it can be seen that while individual phase difference values of both positive and negative sign exist, there are more and larger positive phase difference values than negative phase difference values. Hence, the sum of phase difference values will be positive. This sum is, therefore, a much more reliable indicator of the fault direction than the individual phase difference values. For example, for fault angles of 5° and more, the sum is a very stable and reliable indicator of the fault direction.

FIG. 7 suggests that the angular sensitivity is improved such that fault angles as low as 5° can be distinguished. Thus, the angular sensitivity is increased to 5° instead of the sampling limit of about 360°/N=18°. Correspondingly, the threshold quantity $\epsilon$ may be set to a value corresponding to a 5° fault angle, as an example.

Thus, in the example of FIG. 7 it can be seen that the fault angle sensitivity is increased below the sampling angle: The fault angle sensitivity is about 5° whereas the sampling angle is about 18°. If the same result was attempted by simply using a higher sampling rate, a sampling frequency corresponding to a 5° sampling angle would be specified, which is about 3.6 times higher than the sampling frequency actually used in the example of FIG. 7. This would specify higher-end hardware and sampling circuits, hence costs would increase. Also, with a higher sampling frequency, samples will arrive at smaller time intervals. For protection functions, all the algorithms should be computed before the arrival of the next sample. As the time consumption of the algorithms remains fixed, this would specify a microprocessor with a higher clock rate, increasing the cost even further.

The post-cycle angle monitoring is a generic technique which may be used also in other protection functions, other than direction estimation, in order to increase the angular sensitivity without increasing the sampling frequency.

Fault Direction Determining Program: Three-Phase Calculation

In the above discussion, only a single-line system has been described. In reality, most power distribution systems have three current phases. For such a three-phase system, a single representation for the currents in all three current phases can be used. Thus, according to an embodiment, the current signals from all three current phases $I_1$, $I_2$, $I_3$ are combined into a combined current signal. As the single representation, the positive sequence component or positive phase sequence (PPS) current signal $I_{PPS}=I_1+e^{i\omega T/3}\cdot I_2+e^{2i\omega T/3}\cdot I_3$ can be used. Then, the combined current signal can be evaluated, as described above, by calculating the phase difference values based on the combined current signal. Thus, the same analysis as mentioned above for the single-line case can be performed, and the above described method can be applied with the current signal being the positive sequence component or some other combined current signal.

However, in practice this approach is not always stable and may result in a false determination of the fault direction. For example, when using the positive phase sequence component, the phase angle is influenced e.g. by frequency deviation, inherent unbalances in the 3-phase line input, and measurement noise. Consequently, the angle of the PPS current signal is less stable than may be desired.

Therefore, according to a further embodiment, the phase difference values are calculated for each current phase individually, as described above, instead of being calculated for a combined current signal. As a result, the phase difference values for the individual current phases are more stable than the combined current signal. Hence, for each sample index i, three phase difference values $\Delta\phi_p(I_p^{post}(i), I_p^{pre}(i))$ are calculated, one for each current phase p. Then, the maximum of the three phase difference values is taken and, using the maximum, the accumulated phase difference parameter $\Delta\phi$ is obtained as described above. For example, the accumulated phase difference parameter $\Delta\phi$ can be obtained as $$\Delta\phi=\Sigma_{i=1}^{n*N}\max_p\Delta\phi(I_p^{post}(i),I_p^{pre}(i)).$$

This way, we ensure that the single quantity (maximum of three angles for three phases) captures the event (for any type of fault). There are other methods for combining the phase differences, e.g. by taking the geometric mean of the phase difference angles.

According to an alternative embodiment, three individual-current accumulated phase difference parameters $\Delta\Phi_p$ are calculated, one for each current phase p. Then, the maximum of the parameters $\Delta\Phi_p$ is taken.

Current Threshold

The above method relies on the pre-fault current as the polarizing quantity, instead of e.g. the voltage. Therefore, to judge the direction, as baseline information, the relay has to see valid pre-fault current for a certain duration. If there is no valid pre-fault current of sufficiently stable phase oscillations, the results would be unreliable. Therefore, the magnitude of the fundamental component of the input signal (current) is compared to a current threshold. If the current is not above the current threshold for the last two cycles, no direction information is output. Instead, a "neutral" signal is output indicating inconclusive directional information.

As a threshold, 10% of the nominal current value may be chosen. Then, the magnitude of the fundamental component of the current should be above 10% of the nominal current value for at least two cycles, otherwise the "neutral" signal is output. Such kind of cases might occur when for example, the device is turned on a during fault condition, e.g., in a case of switch on to fault state.

Fault Direction Determining Program

Figure 5:
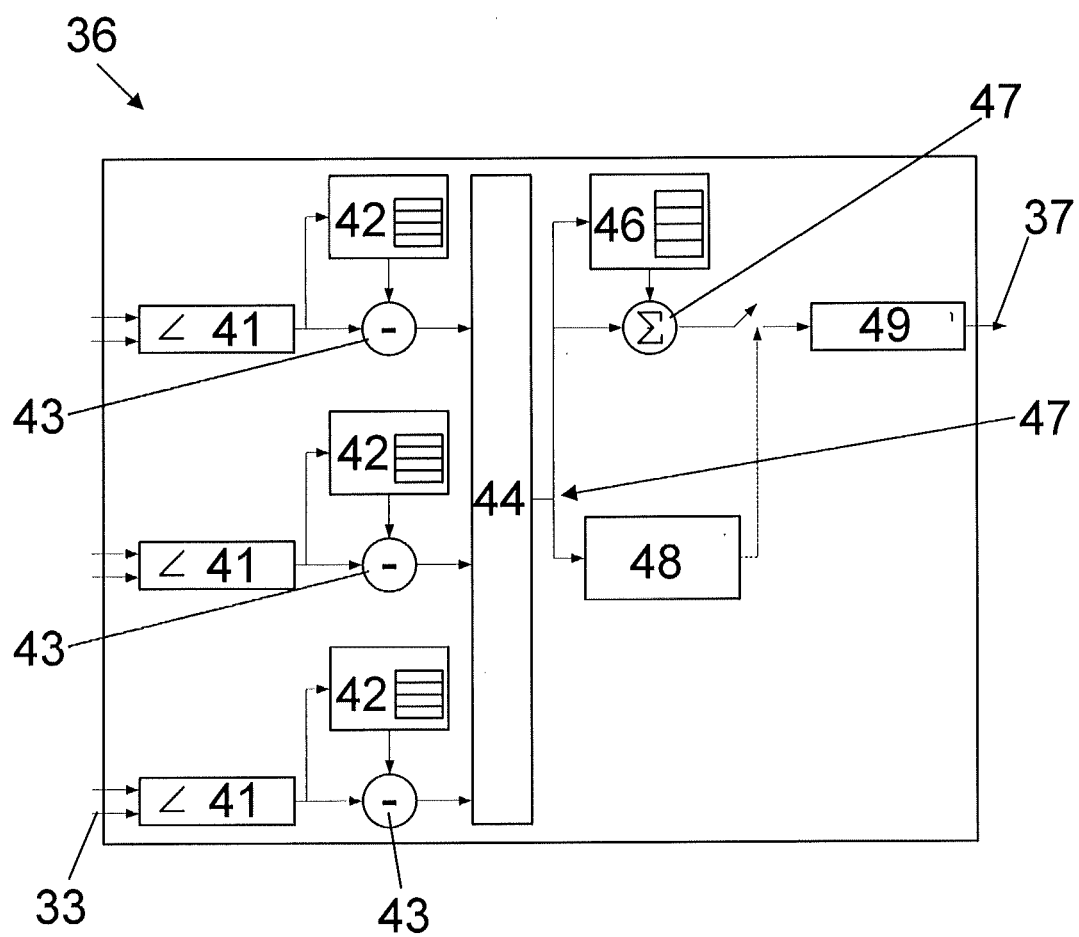
FIG. 5 shows a decision logic section of a fault direction indicator device in accordance with an exemplary embodiment of the present disclosure.

FIG. 5 shows a decision logic section of a fault direction indicator device in accordance with an exemplary embodiment of the present disclosure. FIG. 5 shows a signal processing sequence of a fault direction determining program of the decision logic section 36 according to the above algorithm. First, the current signal including the complex-number pre-fault and post-fault current values is received from the input section (arrows 33). Then, a phase angle extraction module 41 determines the phase angle of the respective current values. The phase values can be computed e.g. by Fourier analysis or other methods. For example, if the arctan function is used as described above, this function may be implemented by a table lookup so as to speed up computation. The phase angles are stored in a phase angles storage 42. In the case of a fault, the N*n pre-fault angles are available and the N*n post-fault angles are or will soon be available. Then, a phase angle subtractor 43 subtracts the i-th post-fault angle from the i-th pre-fault angle and thus determines the i-th phase difference value $\Delta\phi(I_p^{post}(i), I_p^{pre}(i))$, for i=1 . . . n*N. Then, a maximum-selection section 44 selects the maximum of the phase difference values for each current phase, and the maximum phase angle difference is stored in a storage section.

The above steps or some of the above steps may be performed continuously, even in the absence of a fault. Also, a fault-time indicator section 48 may use the maximum phase difference for determining the time of a fault in the case where a start command is issued, e.g. by comparing the maximum phase difference of each sample i to a threshold value, or by obtaining the maximum phase difference.

After the fault, an accumulator 47 accumulates the maximum phase difference for n post fault cycles, e.g. 2 post fault cycles, e.g. by summing the phase differences, to obtain the accumulated phase difference parameter $\Delta\Phi$. Then, by comparing $\Delta\Phi$ with a threshold value, a determining section 49 determines the fault direction as described above.

Fault Direction Determining Program: Two Programs

In an exemplary embodiment disclosed herein, the decision logic 36 may further include a second fault direction determining program, besides the above-described (first) fault direction determining program. The second fault direction determining program determines the fault direction from the transmission line data in addition, but according to a different algorithm. Then, the second fault direction determining program outputs a second fault direction indicator. The first fault direction determining program and the second fault direction determining program may run either on the same hardware (e.g. in parallel) or on different pieces of hardware.

Further, according to the optional embodiment, the decision logic 36 includes a decision joining program for determining a fault direction from the first fault direction indicator and from the second fault direction indicator. Then, the resulting determined fault direction is outputted by the decision joining program as a third fault direction indicator.

In the case of the fault direction indicators being in mutual disagreement over the fault direction, the decision joining program may determine the fault direction as neutral, or by decision weighting, e.g., by attributing different weightings to the first and the second fault direction indicator, and by taking the result with the higher weighting. The weightings may be determined by the respective fault direction determining programs and themselves in dependence of their input data. Also, in the case of mutual disagreement (and possibly of similar weightings associated to each of the disagreeing sides), the decision joining program may issue a neutral output which may, in a circuit breaker configuration, then possibly lead to the breaker disabling a larger portion of the network.

The above decision joining can be implemented through three or more fault direction determining programs. The decision joining program may include a (possibly weighted) voting routine.

The use of more than one fault direction determining program can be useful when different types of fault direction determining programs are used. So, for example, the second fault direction determining program can be programmed according to a machine learning-based algorithm or to a rule-based algorithm. Then, in the case of mutual agreement between the different approaches, the risk of an error is reduced and the stability is increased. Also, errors can be detected easier because even if one fault direction determining program issues an incorrect result, this error may be detected and overridden, or will at least lead only to a neutral output, and not to a more problematic incorrect output.

While the fault direction indicator device 30 is useful on its own, it is can be useful when integrated into a monitoring system or a circuit breaker system (relay). For this purpose, an optional communication section of the fault direction indicator device 30 allows it to transmit the determined fault direction (e.g., the fault direction indicator indicating e.g. a forward or backward fault) to another unit of the power distribution network, e.g. to a circuit breaker, to a control unit, or to a supervising unit for supervising the transmission line 10.

Figure 8:
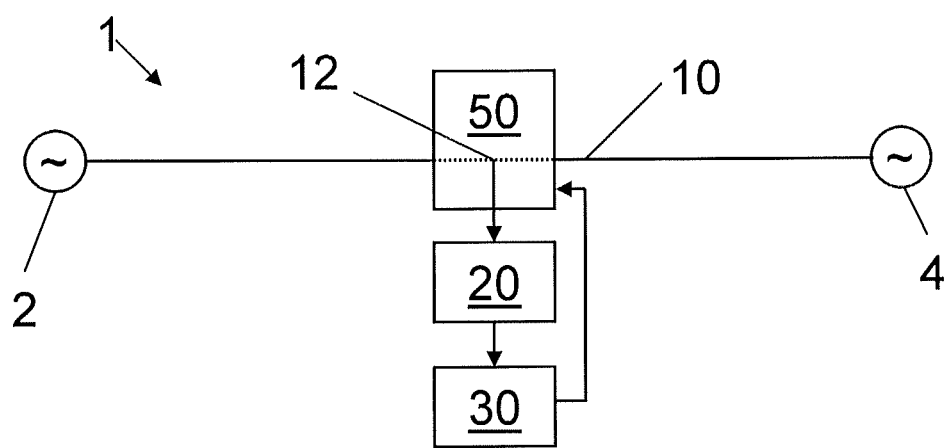
FIG. 8 shows a power distribution system, including a circuit breaker, in accordance with an exemplary embodiment of the present disclosure.

FIG. 8 shows a power distribution system, including a circuit breaker, in accordance with an exemplary embodiment of the present disclosure. FIG. 8 shows a configuration in which the power distribution system 1 includes a circuit breaker 50 (e.g. an REF circuit breaker from ABB). The circuit breaker 50 is operatively coupled to the fault direction indicator device 30, possibly via a central control unit (not shown). Thereby, the circuit breaker can receive, from the fault direction indicator device 30, at least one of the first, second, and third fault direction indicator, or some other fault direction information obtained therefrom, such as likelihood information or a neutral output. This output may then trigger the circuit breaker 50, or the central control unit, to take appropriate action, e.g. to cut the appropriate section, not the entire line 10. In the case of an "inconclusive information" output, a larger portion such as the entire line 10 may be cut.

Power Flow Direction

In an exemplary embodiment, the decision logic section 36 (see e.g., FIG. 1) further include a power flow direction determining program for determining a power flow direction from the transmission line data. The monitoring of power flow can be performed in regular intervals or permanently, independently of a fault.

The additional power flow information from the power flow direction determining program may also be used for controlling the circuit breaker 50 shown in FIG. 8. Power flow from the grid 4 to the source 2 is unwanted, since energy is thereby wasted. Thus, if this unwanted power flow is detected (possibly over a predetermined time interval), circuit breaker 50 may be activated to break the appropriate section so as to limit the waste of energy.

So, in this case the device 30 can be described as a hook-up power flow direction device to detect if there is unwanted power flow. This device is, for example, useful for distributed generation units like wind/solar power systems. These units might stop producing, and in this case the power will start flowing in opposite direction (from grid 4 to generator 2). From the point of view of the currents involved, this situation is similar to an upstream fault condition (as described above), except that there is no actual fault. Hence, the directional device could detect this kind of situation with the algorithms described herein, and activate the circuit breaker 50 or issue a warning.

Smart Grids

In known networks the energy delivery takes place through the transmission grid (HV) via HV transformers to the distribution grid and through distribution transformers to the LV and final users. This can also be described as a "top-down" power flow from the main power plants via the various transmission networks to the power plug in the wall. The protection scheme for the power plant and network is done accordingly. With the introduction of more distributed power generation, mainly by alternative energies, the direction of power flow can, however, change under certain environmental conditions. For example, distributed units may at some times act as power sources feeding power into the grid, and at other times consume power from the grid.

A known directional overcurrent function, referenced to the voltage phases, cannot adapt or distinguish when the flow of power (or current at a given voltage phase angle) changes direction due to more energy being generated by distributed generation units than is consumed in the grid to be protected. The known directional overcurrent function is unable to adapt to the changed situation as the changed pre-fault condition (inversed power flow) is not taken into account as the voltage phase is not changing.

By utilizing the pre-fault current as a reference for the directional information according to an embodiment of the present disclosure, under fault conditions the protection function is enabled to adapt to the changed situation, e.g., the changed pre-fault power flow. Hence, the function described in the patent application will always protect the network by "switching off" the power source by tripping in the forward direction, because the forward direction is always defined as the direction towards the fault from the view of the current power source.

For example, consider a first case in which power flows in the normal direction from central power source to distributed units. Then, in the case of a fault, assuming the relay trips in the forward condition and blocks in the backward condition, the relay will isolate the main power source from the fault location: The relay in the forward direction to the fault trips, while the relay in the backward direction blocks. As the fault is still present, it might be that some power still gets fed to the fault, through the previously blocked relay, from a distributed unit located after the fault. In this case the current flow will change, as the distributed unit is feeding into the fault. If the current is again overstepping the setpoint, e.g., trigger a trip command, the previously blocked relay will now trip as the fault is now in forward direction from that relay. This is one example how a protection system for the currents can adapt to changed conditions and protect and isolate the source from the fault.

In a second case, the distributed units feed energy into the distributed network. In case of a fault, the relay trips in the forward direction and blocks in the backward direction. Thereby, the distributed unit gets disconnected from the fault as the pre-fault current was in the direction of the HV grid connection (towards the central power source as viewed from the grid). Also, in this example, if the fault is still present after the distributed unit is disconnected, the power direction is inversed and the HV grid is feeding into the fault. Hence, the blocking relay now sees a changed pre-fault current: Now also this relay will see a forward current flow and will trip immediately so that the fault becomes completely isolated.

In the following, some exemplary embodiments of the disclosure will be described. According to a further embodiments disclosed herein, another fault parameter that is not a fault direction parameter may be obtained in an analogous manner.

In an exemplary embodiment of the present disclosure, a fault direction indicator device for indicating a direction of a fault on a transmission line of a power distribution system relative to a measurement location of the transmission line is provided. The fault direction indicator device includes an input section adapted to receive transmission line data, the transmission line data including local fault-direction indicative data measured by a measuring unit at the measurement location, wherein the transmission line data includes, from the local fault-direction indicative data, only a current signal; and a decision logic section operatively connected to the input section, the decision logic section comprising a first fault direction determining program for determining the fault direction from the transmission line data and for outputting the determined fault direction as a first fault direction indicator. According to another exemplary embodiment, the first fault direction determining program is programmed according to a machine learning algorithm. In yet another exemplary embodiment disclosed herein, the decision logic further includes a second fault direction determining program, such as a program programmed according to a rule-based algorithm, for determining the fault direction from the transmission line data and for outputting the determined fault direction as a second fault direction indicator, and a decision joining program for determining a fault direction from the first fault direction indicator and from the second fault direction indicator, and for outputting the resulting determined fault direction as a third fault direction indicator.

In still another exemplary embodiment disclosed herein, the first fault direction determining program and, if present, the second fault direction determining program are programmed according to at least one respective algorithm selected from the group including of Min-Max algorithm, Comparator algorithm, Sign algorithm, Frequency analysis algorithm, Blackbox algorithm, Mathematical model-based algorithm, and Fuzzy Logic algorithm. According to an exemplary embodiment of the present disclosure, the current signal includes a pre-fault current signal ($I_{pre}$) and a fault current signal ($I_1$, $I_2$); and the first fault direction determining program is programmed to determine a relation between the fault current signal ($I_1$, $I_2$) and the pre-fault current signal ($I_{pre}$), and to determine the fault direction from the determined relation. According to another exemplary embodiment, no voltage signal or mixed current-voltage signal is included in the transmission line data: The transmission line data is free of data resulting from a voltage measurement.

According to an exemplary embodiment, the threshold value corresponds to a phase angle that is less than the sampling rate phase angle.

According to another exemplary embodiment, the plurality of pre-fault current values includes n pre-fault current values, and the plurality of post-fault current values includes n post-fault current values, and the plurality of phase difference values includes n phase difference values, n being at least 1, e.g. larger than 1 and/or not larger than 3. In another exemplary embodiment, an i-th one of the pre-fault current values, for (each) $1 \leq i \leq n$, corresponds to a respective i-th pre-fault time, and an i-th one of the post-fault current corresponds to a respective i-th post-fault time, e.g., the pre-/post-fault current was measured at the respective time, and an (each) i-th one of the phase difference values is indicative of a phase difference between the i-th pre-fault current and the i-th post-fault current, respectively. Still, another exemplary embodiment disclosed herein provides, the i-th pre-fault times and the respective i-th post-fault times are separated by an integer number of AC periods. According to a further exemplary embodiment, the phase difference values are accumulated over a time interval which is longer than one AC period, e.g. at least two AC periods. According to an exemplary embodiment of the present disclosure, the phase difference values relate to post-fault current values that span a time interval being longer than one AC period and being after the fault. In an exemplary embodiment disclosed herein, the pre-fault times and/or post-fault times span a time interval which is longer than one AC period, e.g. two AC periods; phase difference values.

According to an exemplary embodiment, the accumulated phase difference parameter is obtained according to the formula $\Delta\phi = \sum_{i=1}^{n*N} \Delta\phi(I^{post}(i), I^{pre}(i))$. Here, n is a positive number, for example, an integer number and/or greater than 1; N is the number of samples within an AC cycle; $\Delta\phi(a, b)$ is the phase difference between two complex numbers a and b, computed e.g. by Fourier analysis or other methods; and $I^{post}(i)$, $I^{Pre}(i)$ are the i-th post-fault and i-th pre-fault complex-number currents, respectively. In yet another exemplary embodiment, $I^{post}(i)=I_{k+i}$; $I^{pre}(i)=I_{k+i-m*N}$, wherein $I_i$ is the i-th sampled current value, i being a discrete time index, k is the index corresponding to a time proximate to the fault event, e.g. just before the fault, and m is a positive integer number, wherein, in exemplary embodiments, n is 2 or more, and wherein in an exemplary embodiment m=n.

According to an exemplary embodiment disclosed herein, the transmission line includes a plurality of phases, especially three phases, and the method provides measuring the current at each of the phases, and determining respective phase difference values for each of the plurality of phases separately. According to another embodiment, the plurality of phase difference values are accumulated by selecting, from the three phases, a maximum phase difference value to be accumulated or a maximum accumulated phase difference parameter. Here, the maximum refers to the absolute value. According to another exemplary embodiment, a magnitude of the current values is compared to a threshold value. In case the magnitude of a respective one of the current values is lower than the threshold value, at least some of the phase difference values are discarded and/or a "neutral" command is issued.

In accordance with an exemplary embodiment, the measuring includes measuring a current but measuring no voltage of the transmission line. In yet another exemplary embodiment, the fault direction parameter can be obtained as "forward fault" or "backward fault" based on the sign of the accumulated phase difference parameter. According to still other exemplary embodiments, the fault direction parameter can be obtained as "neutral" if the absolute value of the accumulated phase difference parameter is less than a threshold value.

An exemplary embodiment disclosed herein, the fault direction indicator device includes the measurement unit, the measurement unit having a current sensor for measuring the current at the measurement location of the transmission line but no voltage sensor, wherein the measurement unit is operatively coupled to the input section for transmitting the current signal obtained from the current measurement to the input section.

In another exemplary embodiment of the present disclosure, a directional overcurrent relay including a fault direction indicator device as described herein is provided. The relay further has a circuit breaker operatively coupled to the fault direction indicator device for receiving, from the fault direction indicator device, the fault direction parameter, possibly in a processed form, e.g., a parameter including information from the fault direction parameter.

According to yet another exemplary embodiment, any of the devices described herein are used in an outdoor and/or smart grid power distribution network, e.g., a power distribution network with distributed units, the grid being adapted such that the distributed units may feed power into the grid during normal operation.

In accordance with an exemplary embodiment described herein, the current value may be processed as a complex number or array of complex numbers. In another exemplary embodiment, the phase angle value may be obtained by looking up a table such as a table of values of an arctan function or a similar function. Another exemplary embodiment disclosed herein provides that the accumulating may include forming a sum of values or a weighted sum of values. In still another exemplary embodiment, the respective phase differences are between respective pre-fault currents and respective post-fault currents being temporally separated from the respective pre-fault currents by an integer number of AC cycles of the transmission line. According to an exemplary embodiment, the device includes a storage section for accumulated phase angles. In yet another exemplary embodiment, the fault parameter can be output more than one AC after the fault event, e.g. at least 2 AC cycles after the fault event. Correspondingly, the phase difference values can be accumulated over more than one AC after the fault event, e.g. at least 2 AC cycles.

While the foregoing is directed to embodiments, other and further embodiments may be devised without departing from the basic scope determined by the claims.

Thus, it will be appreciated by those skilled in the art that the present disclosure can be embodied in other specific forms without departing from the spirit or essential characteristics thereof. The presently disclosed embodiments are therefore considered in all respects to be illustrative and not restricted. The scope of the disclosure is indicated by the appended claims rather than the foregoing description and all changes that come within the meaning and range and equivalence thereof are intended to be embraced therein.

What is claimed is:

1. A method of determining a fault parameter, including a fault direction parameter, of a fault on an AC transmission line of a power distribution system relative to a measurement location of the transmission line, the method comprising:
   measuring a time-dependent current of the transmission line at the measurement location;
   transmitting a current signal indicative of the measured current to a decision logic section, the current signal including a plurality of pre-fault current values and a plurality of post-fault current values;
   determining, by the decision logic section, a plurality of phase difference values indicative of respective phase differences between respective ones of the pre-fault current values and respective ones of the post-fault current values;
   accumulating the plurality of phase difference values into an accumulated phase difference parameter;
   obtaining the fault parameter by comparing the accumulated phase difference parameter to a threshold value; and
   outputting the determined fault parameter,
   wherein measuring a time-dependent current of the transmission line includes measuring a current but measuring no voltage of the transmission line.

2. The method according to claim 1, wherein the plurality of pre-fault current values includes n pre-fault current values, and the plurality of post-fault current values includes n post-fault current values, and the plurality of phase difference values includes n phase difference values, n being at least one of freater than 1 and less than 3,
   wherein an i-th one of the pre-fault current values, for $1 \leq i \leq n$, corresponds to a respective i-th pre-fault time, and an i-th one of the post-fault current values corresponds to a respective i-th post-fault time, and
   wherein an i-th one of the phase difference values is indicative of a phase difference between the i-th pre-fault current value and the i-th post-fault current value, respectively.

3. The method according to claim 2, wherein the i-th pre-fault times and the respective i-th post-fault times are separated by an integer number of AC periods.

4. The method according to claim 1, wherein the phase difference values are accumulated over a time interval which is longer than one AC period, in relating to post-fault current values that span a time interval being longer than one AC period and being after the fault.

5. The method according to claim 1, wherein the accumulated phase difference parameter is obtained according to $$\Delta\phi = \Sigma_{i=1}^{n*N} \Delta\phi(I^{post}(i), I^{pre}(i)),$$

wherein n is a positive number, N is a number of samples within an AC cycle, $\Delta\phi(a, b)$ is a phase difference between two complex numbers a and b; and $I^{post}(i)$, $I^{pre}(i)$ are the i-th post-fault and i-th pre-fault complex-number currents, respectively,
wherein, $I^{post}(i) = I_{k+i}$; $I^{pre}(i) = I_{k+i-m*N}$, wherein $I_i$ is the i-th sampled current value, k is the index corresponding to a time proximate to the fault event, and m is a positive integer number, wherein, n is 2 or more, and wherein, m=n.

6. The method according to claim 1, wherein the transmission line includes a plurality of phases, the method comprising:
   measuring the current at each of the phases; and
   determining respective phase difference values for each of the plurality of phases separately.

7. The method according to claim 6, wherein the plurality of phase difference values are accumulated by selecting, from the three phases, a maximum phase difference value to be accumulated or a maximum accumulated phase difference parameter.

8. The method according to claim 1, comprising:
   comparing a magnitude of the current values to a threshold value, and, when the magnitude of a respective one of the current values is lower than the threshold value, discarding at least one of some of the phase difference values and issuing a "neutral" signal.

9. The method according to claim 1, wherein the fault parameter is a fault direction parameter including "forward fault" or "backward fault", that corresponds to mutually opposite signs of the accumulated phase difference parameter.

10. The method according to claim 1, wherein the fault parameter is a fault direction parameter including "neutral", and wherein the fault direction parameter is "neutral" when the absolute value of the accumulated phase difference parameter is less than a threshold value.

11. A fault parameter indicator device for indicating a fault parameter including a fault direction parameter of a fault on an AC transmission line of a power distribution system relative to a measurement location of the transmission line, the fault parameter indicator device comprising:

an input section for receiving a current signal indicative of a time-dependent current measured by a measuring unit at the measurement location, the current signal having a plurality of pre-fault current values and a plurality of post-fault current values;

a decision logic section configured for determining the fault parameter based on the current signal, the decision logic section including:

a phase difference value determining sub-section configured to determine a plurality of phase difference values indicative of respective phase differences between respective ones of the pre-fault current values and respective ones of the post-fault current values;

an accumulating sub-section configured to accumulate the plurality of phase difference values into an accumulated phase difference parameter;

a fault parameter generating sub-section configured to generate the fault parameter by comparing the accumulated phase difference parameter to a threshold value; and a measurement unit having a current sensor for measuring the current at the measurement location of the transmission line, wherein the measurement unit lacks a voltage sensor and is operatively coupled to the input section for transmitting the current signal obtained from the current measurement to the input section.

12. A directional overcurrent relay comprising:

a fault parameter indicator device having an input section for receiving a current signal indicative of a time-dependent current measured by a measuring unit at the measurement location, the current signal having a plurality of pre-fault current values and a plurality of post-fault current values;

a decision logic section configured for determining the fault parameter based on the current signal, the decision logic section including:

a phase difference value determining sub-section configured to determine a plurality of phase difference values indicative of respective phase differences between respective ones of the pre-fault current values and respective ones of the post-fault current values;

an accumulating sub-section configured to accumulate the plurality of phase difference values into an accumulated phase difference parameter;

a fault parameter generating sub-section configured to generate the fault parameter by comparing the accumulated phase difference parameter to a threshold value;

a circuit breaker operatively coupled to the fault direction parameter indicator device for receiving, from the fault parameter indicator device, the fault parameter being a fault direction parameter; and a measurement unit having a current sensor for measuring the current at the measurement location of the transmission line, wherein the measurement unit lacks a voltage sensor operatively coupled to the input section for transmitting the current signal obtained from the current measurement to the input section.

13. An outdoor and/or smart grid power distribution network, comprising:

a fault parameter indicator device having an input section for receiving a current signal indicative of a time-dependent current measured by a measuring unit at the measurement location, the current signal having a plurality of pre-fault current values and a plurality of post-fault current values;

a decision logic section configured for determining the fault parameter based on the current signal, the decision logic section including:

a phase difference value determining sub-section configured to determine a plurality of phase difference values indicative of respective phase differences between respective ones of the pre-fault current values and respective ones of the post-fault current values;

an accumulating sub-section configured to accumulate the plurality of phase difference values into an accumulated phase difference parameter;

a fault parameter generating sub-section configured to generate the fault parameter by comparing the accumulated phase difference parameter to a threshold value; and a measurement unit having a current sensor for measuring the current at the measurement location of the transmission line, wherein the measurement unit lacks a voltage sensor and is operatively coupled to the input section for transmitting the current signal obtained from the current measurement to the input section.

* * * * *